United States Patent [19]

Testone

[11] 4,268,934
[45] May 26, 1981

[54] CLEANER FOR CIRCUIT BOARDS

[75] Inventor: Anthony Q. Testone, Lee, Mass.

[73] Assignee: Statics, Inc., Lee, Mass.

[21] Appl. No.: 74,739

[22] Filed: Sep. 12, 1979

[51] Int. Cl.³ .............................................. A47L 5/22
[52] U.S. Cl. .................................... 15/306 B; 15/202; 15/310
[58] Field of Search ............. 15/306 R, 306 A, 306 B, 15/308, 309, 307, 310, 402, 398, 202

[56] References Cited

U.S. PATENT DOCUMENTS

| | | | |
|---|---|---|---|
| 1,237,047 | 8/1917 | Howell | 15/308 X |
| 3,128,492 | 4/1964 | Hanscom et al. | 15/308 |
| 3,395,042 | 7/1968 | Herbert | 15/308 X |
| 3,882,568 | 5/1975 | Hill | 15/306 A X |
| 3,986,223 | 10/1976 | Kiefer | 15/309 X |

FOREIGN PATENT DOCUMENTS 631092  4/1963  Belgium ..................................... 15/308

Primary Examiner—Christopher K. Moore
Attorney, Agent, or Firm—Irvin A. Lavine

[57] ABSTRACT

A cleaner for circuit boards includes two elongate hollow housings positioned one above the other to provide a slot between two facing walls. Each wall has an aperture therein spaced from its ends, and brushes extending into the slot from the walls, both in advance of and behind the apertures, to restrict air flow to the apertures to entry at the ends of the slot. Ion emitters are carried by each wall, between two brushes in advance of the apertures. Motor driven fans are in the housings to draw air across the printed circuit board and into the apertures. The housings also contain a power supply for the ion emitters and a motor to drive pinch rollers.

21 Claims, 5 Drawing Figures

CLEANER FOR CIRCUIT BOARDS

BACKGROUND OF THE INVENTION

The present invention relates to a cleaner for a printed circuit board, or similar planar object.

In the manufacture of printed circuit boards, it is important that the board be clean before photo-sensitive film is laminated to it, or photo-resist screening is laminated to it. These printed circuit boards, at this stage of their production, have conductive patterns on them of very high line and space definition, meaning that the lines are quite thin, with very small spaces between the lines. Any extraneous material, known in the industry as "trash" is apt to interfere with the circuitry, such as by connecting a pair of conductors where no such connection is desirable. When this occurs, the printed circuit board is unacceptable, and must be rejected. Heretofore, there has been a relatively high rejection rate, despite the utilization of relatively intensive labor input in order to provide the boards free of "trash".

Apparatus has previously been suggested for the cleaning of printed circuit boards. Maca U.S. Pat. No. 3,636,662 and Call U.S. Pat. No. 3,691,582 are examples of machines for cleaning printed circuit boards, which include brushing the boards and applying liquid cleaning material to them.

Murray, et al U.S. Pat. No. 3,117,333 discloses an apparatus for cleaning aperture cards which includes a pair of rotating brushes and electro-static eliminators. These are provided in a first compartment of the machine, and adjacent to that compartment is a second compartment which houses a motor for driving feed rollers and rotating cleaning brushes, and also contains a motor-driven fan. Air enters the cleaning compartment through an upper opening, and passes through a removable filter, and thence through the cleaning compartment, passing through a second removable filter at a lower part of the cleaning compartment, and from thence travels laterally across the bottom of the cleaning compartment, where it passes through an opening in a wall of the cleaning compartment, and into the suction chamber of the motor-driven fan. The apparatus is bulky and the air does not sweep across the objects being cleaned, from the ends, towards the center.

Herbert, Jr. U.S. Pat. No. 3,395,042 discloses a paper-cleaning apparatus which is positioned above a moving web of paper, and which includes a suction nozzle having attached to it an ion emitter, follwed, in the direction of paper movement, by a first brush, an entry for air to be drawn into the nozzle and thence to a blower, and then a second brush, the air being drawn through the two sets of brushes.

Other machines for cleaning webs through use of brushes and ion emitting devices are shown in Sroka U.S. Pat. No. 3,915,737, Landry, et al U.S. Pat. No. 2,920,987 and Schwartz, et al U.S. Pat. No. 2,980,933. Further, Koppehele U.S. Pat. No. 3,189,929 discloses a machine for wiping a traveling film which includes a pair of box-like chambers having spaced, opposed walls providing a slot between them, terry cloth wiping elements mounted on the walls, and suction elements connected to each of the chambers. Durst U.S. Pat. No. 3,643,277 shows a machine for cleaning slats of venetian blinds, utilizing feed rollers, brushes of a rotating character, and a sprayer for liquid material.

SUMMARY OF THE INVENTION

The present invention provides a cleaner for such objects as printed circuit boards, and includes an upper elongate housing and a lower elongate housing, which are of identical size and shape. The bottom wall of the upper housing and the upper wall of the lower housing are spaced apart, so as to provide a slot between them. Each of these facing walls has an aperture in it for admitting air into the housing, and these apertures are spaced from the ends of the housings, and therefore from the ends of the slot. Each of the walls carries brushes which extends into the slot so as to engage a circuit board inserted into the slot, the brushes being of such high density that they effectively prevent air from moving through them, so that the brushes restrict the access of air to the apertures to the ends of the slot. In particular, at the entry portion of the slot, there are, in the direction of movement of the printed circuit board, a first set of upper and lower brushes, followed by a set of upper and lower ion emitters, and then followed by a second set of upper and lower brushes; behind the apertures, there are two sets of upper and lower brushes. The housing preferably extruded aluminum of generally hollow, square transverse gross section, and include T-shaped recesses in one wall, so as to accomodate the spines of the brushes and of the ion emitters. Within the housing, there are motor driven fans, the power supply for the ion emitters, and the motor for driving pinch rollers for causing the circuit board to move through the slot. The upper housing is pivotally supported in relation to the lower housing, so that it may be rotated about an axis parallel to its axis, to thereby expose the brushes and ion emitters for inspection, cleaning and maintenance. Removable filters are provided adjacent the apertures.

Among the objects of the present invention is to provide a cleaner for printed circuit boards which will effectively clean "trash" such as dust particles, bits of conductive material, and the like, from the printed circuit board. Another object is the provision of a cleaner for a printed circuit board which will be compact, with motors and the like carried within housings forming a part of the apparatus. Still another object is to provide a cleaner for circuit boards which permits ready access to central parts for cleaning, maintenance and inspection. Many additional objects will be readily apparent from consideration of the following specification, claims and drawings.

DESCRIPTION OF THE PREFERRED EMBODIMENT

Figure 1:
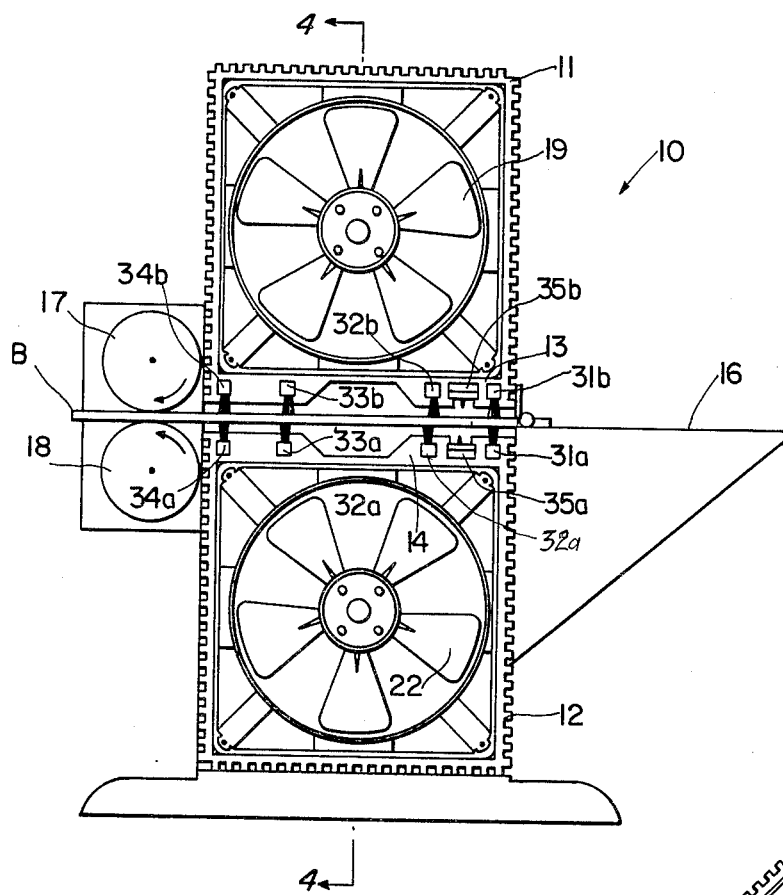
FIG. 1 is an end elevation of a circuit board cleaner in accordance with the present invention.

Referring now to the drawings, wherein like or corresponding reference numerals are used for like or corresponding parts throughout the several views, there is shown in FIG. 1 a cleaner for printed circuit boards and the like in accordance with the present invention and being generally designated 10. Cleaner 10 includes an upper housing 11 and a lower housing 12. The housings 11 and 12 are identical, and preferably of hollow, square transverse cross-section, and made of extruded aluminum. The upper housing 11 has a lower wall 13, and the lower housing 12 has an upper wall 14. Details of these walls are discussed hereinbelow. Extending outwardly from the lower housing 12 is a shelf 16, on which the printed circuit board B is placed. Opposite the shelf 16 are a pair of rubber or similar pinch rollers 17, 18, driven in the directions as indicated by the arrows, so as to grab the printed circuit board and withdraw it from the apparatus. In the upper housing 11 there is shown a fan 19 and in the lower housing 12 there is shown a fan 22.

Figure 2:
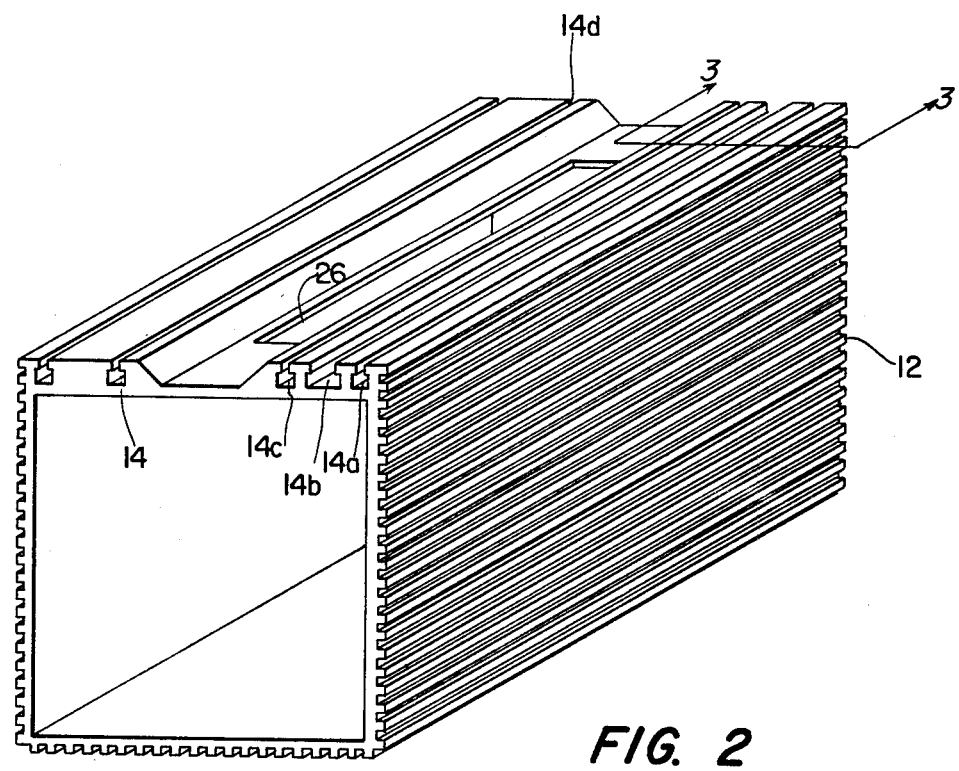
FIG. 2 is a perspective view of a housing, with parts removed, forming a part of the cleaner for circuit boards of FIG. 1.

Referring now to FIG. 2, there may be seen, in perspective, the lower housing 12, which is of hollow cross-section. It is preferably made as an aluminum extrusion, and the upper housing 11 is made from a part of the same aluminum extrusion. The housing 12 has an upper wall 14 having at a first portion three T-shaped axially extending recesses 14a, 14b, 14c. These are located in a first, relatively thick portion of the upper wall 14, and spaced from them, in a second relatively thick portion of the upper wall 14, are additional T-shaped recesses 14d, 14e, which are also parallel to the axis of the housing 12. In its middle region, the upper wall 14 has a relatively small thickness, and is provided with an aperture 26, which is spaced from the ends of the housing 12.

Figure 3:
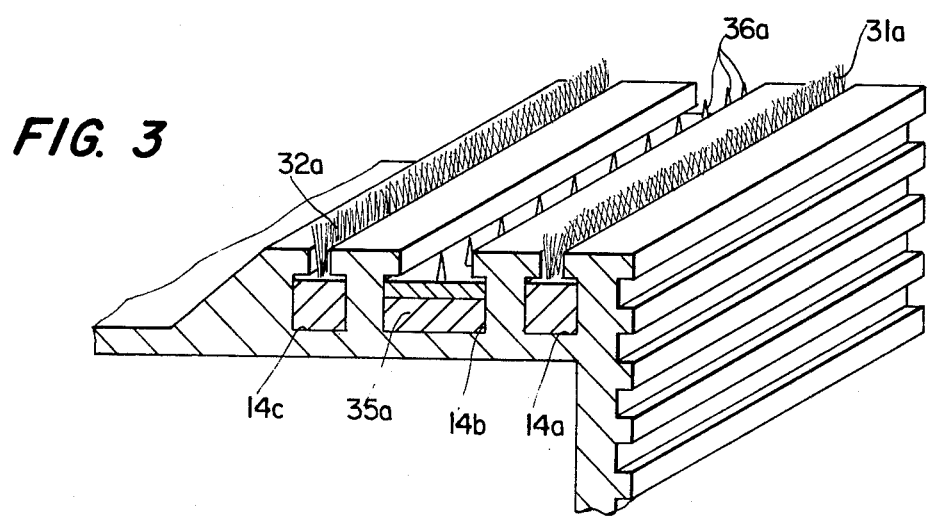
FIG. 3 is an enlarged cross-sectional view taken on the line 3—3 of FIG. 2, and showing brushes and ion emitters in place.

Referring now to FIG. 3, there may be seen in the T-shaped recesses 14a, and 14c the brushes 31a, and 32a. These brushes 31a and 32a are identical to all of the brushes in the cleaner 10, and have a cross-section of generally T-shape, the head of the T being formed by the spine of the brush, and the stem of the T being provided by the bristles of the brush, which extend perpendicularly to the spine of the brush, the spine of the brush being located in the head of the T-shaped recess 14a, 14c, etc. with the bristles extending beyond the upper surface of the wall 14.

In the T-shaped axially extending recess 14b, there is provided an ion emitter 35a, which is preferably made in accordance with Testone U.S. Pat. No. 3,968,405, wherein there is a board-like construction providing a spine, and pointed wires extending perpendicularly from a surface of the board or spine, and being located in a row or rows. Thus, as shown in FIG. 3, the ion emitter 34a may be seen to comprise a board or spine-like portion forming the head of a T with the wires 36a extending therefrom, and through the recess 14b, to thereby emit ions in the regions between the brushes 31a and 32a.

Figure 4:
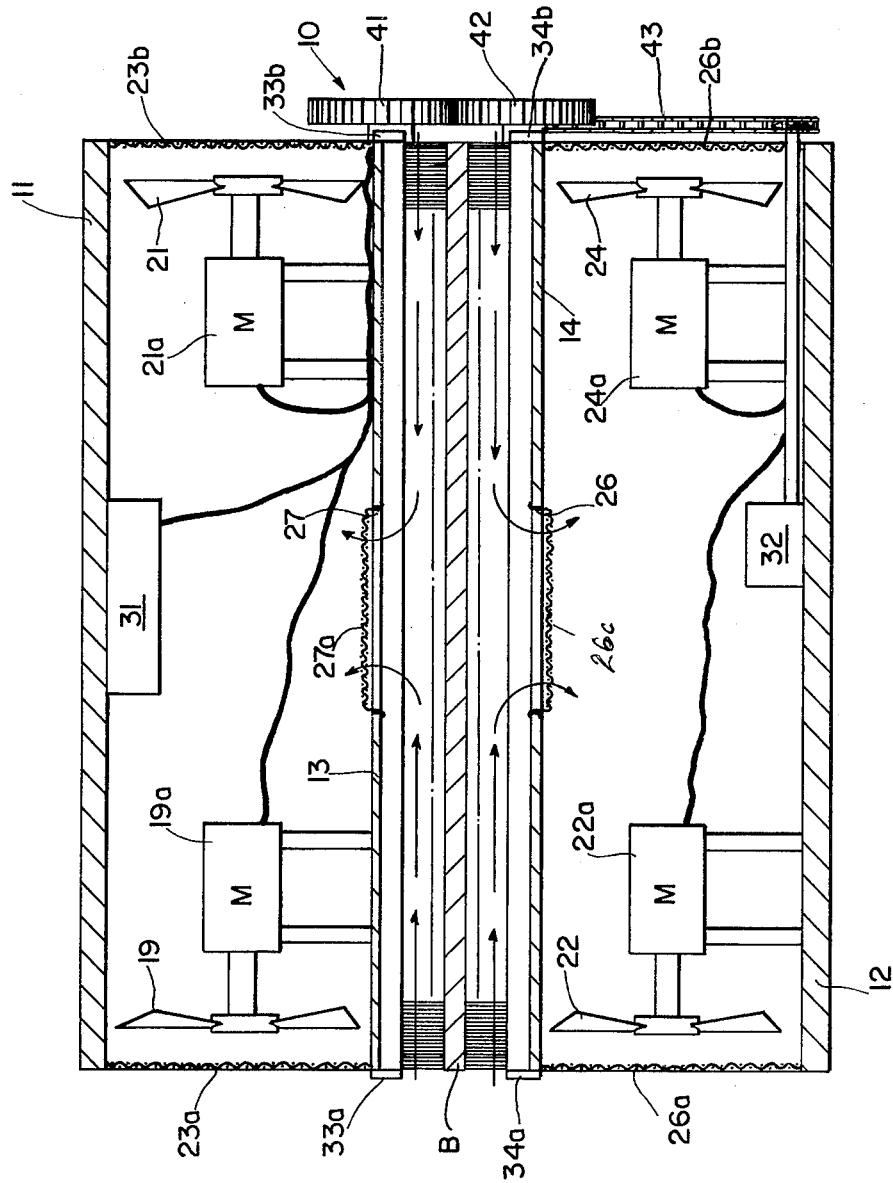
FIG. 4 is a cross-sectional view taken on the line 4—4 of FIG. 1, and being partly schematic, and with parts broken away.

Referring now to FIG. 4, there may be seen the upper housing 11 and the lower housing 12. In the upper housing 11 are the fan 19 at one end of the housing, and the fan 21 at the other end of the housing, fan 19 being driven by a motor 19a and fan 21 being driven by a motor 21a. These motors are suitably supported adjacent the ends of the housing 11, and the end openings of the housing 11 are provided with screens 23a and 23b. The lower wall 13 may be seen to have an aperture 27 therein, located so that it is spaced from the ends of the housing 11. In practice, the area of opening of the aperture 27 is equal to the exhaust areas provided by the ends of the housing 11, so that the area of the aperture 27 through which air enters into the housing 11 is equal to the area through which the air discharges, through the two ends of the housing 11. In the lower housing 12, there may be seen the fan 22 at one end, and the fan 24 at the other end, driven by the motors 22a and 24a respectively. Adjacent fan 22 is the screen 26a, and adjacent the fan 24 is the screen 26b. In the upper wall 14, there may be seen the aperture 26, and the same equality of inlet and exit areas is provided in the lower housing 12 as in the upper housing 11.

Provided in the upper housing 11 is a power supply 31, which is connected to the ion emitters which are carried by both the upper and lower housings, and in the lower housing 11 there is a motor 32 which serves to drive the pinch rollers 17 and 18. Conduits leading to the various fan motors, power supply 31 and pinch roller drive motor 32 are indicated schematically. At the ends of the housing 11 there are provided brackets 33a and 33b, and at the ends of the housing 12 there are provided brackets 34a and 34b, which serve to support the pinch rollers 17 and 18 in known fashion, the pinch rollers being driven by the gears 41 and 42, the latter being driven by a chain drive 43 from the motor 32 located in housing 12. Removable filters 26a and 27a are provided for the apertures 26 and 27.

Referring again to FIG. 1, there may be seen the hollow housings 11 and 12 with the spaced lower wall 13 and upper wall 14 thereof, respectively, providing a slot between them, and in the entry region of the slot, the region adjacent the entry support shelf 16, there are the aforementioned brushes 31a and 32a, with the ion emitter 35a between them. Extending downwardly from the bottom wall 13 of upper housing 11 are a brush 31b, and a second brush 32b, with an ion emitter 35b between them. Thus, in the entry portion of the slot between the housings 11 and 12 there are a first set of brushes 31a, 31b, followed by a set of ion emitters 35a and 35b, and a second set of brushes 32a and 32b. In FIG. 1 there may also be seen the two sets of brushes in the exit portion of the noted slot, which is after the apertures in the walls 13 and 14, in the direction of movement of the printed circuit board B, and these are designated 33a and 33b, forming a first set and 34a and 34b forming a second set, the brushes 33a and 34a being carried by the wall 14 and the brushes 33b and 34b being carried by the wall 13.

In FIG. 1, the thin portion of the walls 13 and 14 may be seen, providing for the entry of air into the cleaner 10 from the ends of the housing, above and below the printed circuit board B.

Figure 5:
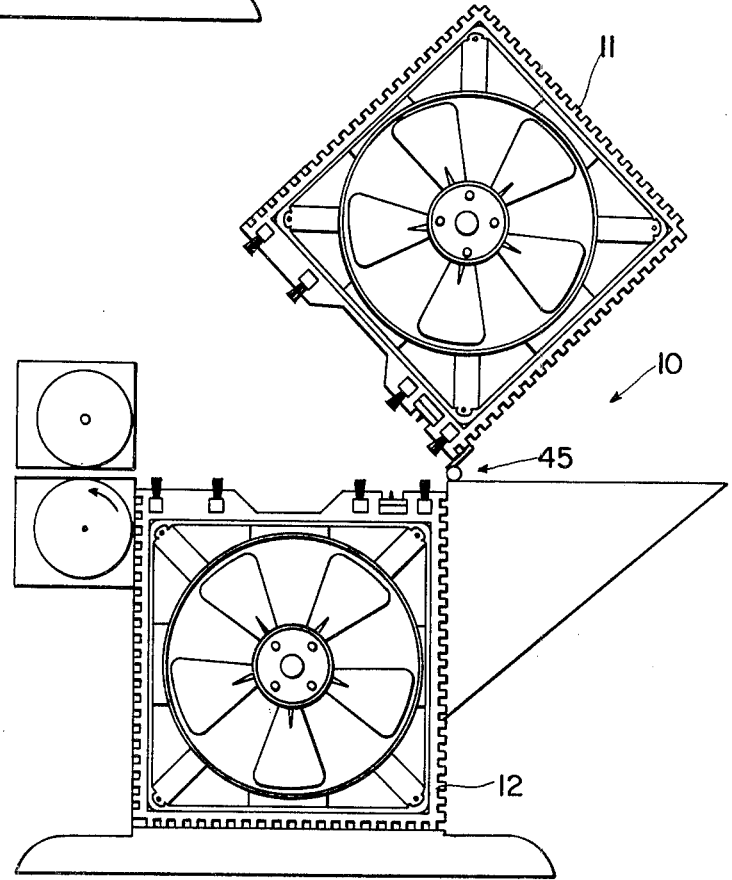
FIG. 5 is a view similar to FIG. 1, and showing the apparatus in an alternate position.

Referring now to FIG. 5, there may be seen the cleaner 10 in a position in which it is opened for inspection, maintenance, etc., the movement being effected by a hinge structure 45, having an axis which is parallel to the axis of the housings 11 and 12, and positioned adjacent to the slot between the housings.

In operation, a printed circuit board B is placed on the shelf 16 and is moved into the slot between the housings 11 and 12. It will be understood that the fan motors are operating to drive the fans 19, 21, 22 and 24, that motor 32 is driving the pinch rollers 17 and 18, and that the power supply 31 supplies energy to the ion emitters 35a and 35b. The printed circuit board B engages the first set of brushes, where it is subjected to a brushing action, and the leading edge of the printed circuit board B then passes between the set of ion emitters 35a and 35b, where particles are made statically neutral, and therefore non-adhering to the printed circuit board B. Then the board engages the second set of brushes 32a and 32b, and begins to pass across the apertures 26 and 27. The board B then continues along the path between the entry and exit portions or regions of the slot, being engaged by the third set of brushes 33a and 33b and the fourth set of brushes, 34a and 34b, and is then grasped by the pinch rollers 17 and 18 and driven from the cleaner 10 by the pinch rollers. The brushing of the printed circuit board B, and the introduction of ions serve to remove any particles, or cause them to be only loosely adhered to the printed circuit board B, and the printed circuit board B is swept by air moving inwardly from the ends or lateral edges of the slot of cleaner 10, transversely across the circuit board B, and thence into the apertures 26 and 27, with the result that the circuit board B is cleansed and is rendered free of the above-noted "trash". The four sets of brushes serve not only to engage and dislodge "trash", but, in addition, serve to prevent movement of air to the apertures 26 and 27 from the entry and exit portions of the slot, but restrict movement of air to a direction transversely of the direction of movement of the printed circuit board B.

The printed circuit board cleaner 10 is highly effective, and is made of readily fabricated parts, and is thereby relatively economical. In practice, the cleaner 10 is able to clean printed circuit boards between 1/32 inch and ⅛ inch thick. The printed circuit board cleaner is readily inspected, maintained and cleaned, due to its hinged construction.

It will be obvious to those skilled in the art that various changes may be made without departing from the spirit of the invention, and therefore the invention is not limited to what is shown in the drawings and described in the specification but only as indicated in the appended claims.

I claim:

1. A cleaner for a printed circuit board or the like comprising:
   an upper hollow, elongate housing having a lower wall having an aperture therein,
   a lower hollow, elongate housing having an upper wall having an aperture therein,
   means for mounting said housings with their longitudinal axes substantially parallel with their said walls spaced apart to provide a slot therebetween having ends, an entry portion between said ends in advance of said apertures and an exit portion between said ends behind said apertures,
   means for drawing air into said housings through said apertures, and
   means for restricting entry of air into said slot to the ends thereof,
   whereby a circuit board passing from said entry portion to said exit portion along a path across said slot is swept by air entering said slot at the ends thereof and entering said housings through said apertures.

2. The cleaner of claim 1, said mounting means including means for supporting said upper housing for pivotal movement on an axis parallel to said housing axes and adjacent said slot.

3. The cleaner of claim 1, said air drawing means comprising motor driven fan means in each said housing.

4. The cleaner of claim 1, said air restricting means comprising brushes extending from each said housing into the slot between said housings and transversely of a path between said entry and exit portions.

5. The cleaner of claim 4, and ion emitting means for emitting ions into the slot between said housings.

6. The cleaner of claim 5, said ion emitting means comprising a set of upper and lower ion emitting means in advance of said apertures.

7. The cleaner of claim 6, there being a first set of upper and lower brushes adjacent said aperture, said ion emitting means located in advance of said first set of brushes, and a second set of brushes in advance of said ion emitting means.

8. The cleaner of claim 5, and power supply means for said ion emitting means in at least one of said hollow housings.

9. The cleaner of claim 1, said air restricting means comprising brushes extending from each said housing into the slot between said housings, and transversely of a path between said entry and exit portions, said brushes being located in advance of and and behind said apertures.

10. The cleaner of claim 9, said apertures being spaced from the ends of said housings, to thereby cause air to flow from the ends of said housing transversely across a planar object in said slot.

11. The cleaner of claim 1, said apertures being spaced from the ends of said housings, to thereby cause air to flow from the ends of said housing transversely across a planar object in said slot.

12. The cleaner of claim 1, said means for drawing air into said housings comprising fans, discharge outlet openings in said housings, said discharge outlets openings in each housing having substantially the same area as the aperture in each said housing.

13. The cleaner of claim 1, at least one said housing having axially extending recesses in the said wall thereof, said air restricting means comprising a brush having a longitudinal spine in a said recess, and ion emitting means having a longitudinal spine in a said recess.

14. The cleaner of claim 13, said housing wall having three parallel recesses therein, there being the spines of two brushes in two said recesses, and the spine of said ion emitting means in a recess intermediate said recesses having said spines of said brushes therein.

15. The cleaner of claim 13, at least one said recess being of T-shape in transverse cross section.

16. A cleaner for a printed circuit board or similar planar object having spaced lateral edges comprising:
   means defining a slot for passage therethrough of a planar object to be cleaned, the object having a thickness less than the depth of said slot and also having lateral edges,
   said slot having lateral edges, and having spaced apart entrance and exit regions between said lateral edges for entrance and exiting of an object, and
   means for causing air to move inwardly into said slot only from the lateral edges thereof and transversely across the surfaces of a planar object in said slot from the lateral edges of the object, and for removing air from said slot.

17. The cleaner of claim 16, said last mentioned means comprising means for restricting entrance of air into said slot substantially to said lateral edges of said slot.

18. The cleaner of claim 17, said air restricting means comprising brushes in the entrance and exit regions of said slot extending transversely of and into the slot from said slot defining means and transversely of a path between said entrance and exit regions.

19. The cleaner of claim 18, said slot—defining means comprising a wall bounding said slot, recesses in said wall extending transversely of the lateral edges of said slot, said brushes having spines located in said recesses.

20. The cleaner of claim 16, and means for emitting ions into said slot.

21. The cleaner of claim 16 or 17, said means for causing air to move comprising aperture means in said slot defining means spaced from the lateral edges thereof, and fan means.